United States Patent
Kaeppeler et al.

(10) Patent No.: US 7,128,785 B2
(45) Date of Patent: Oct. 31, 2006

(54) METHOD FOR DEPOSITING ESPECIALLY CRYSTALLINE LAYERS FROM THE GAS PHASE ONTO ESPECIALLY CRYSTALLINE SUBSTRATES

(75) Inventors: Johannes Kaeppeler, Würselen (DE); Michael Heuken, Aachen (DE); Rainer Beccard, Aachen (DE); Gerhard Karl Strauch, Aachen (DE)

(73) Assignee: Aixtron AG (DE)

( * ) Notice: Subject to any disclaimer, the term of this patent is extended or adjusted under 35 U.S.C. 154(b) by 25 days.

(21) Appl. No.: 10/685,233

(22) Filed: Oct. 14, 2003

(65) Prior Publication Data
US 2004/0129215 A1 Jul. 8, 2004

Related U.S. Application Data

(63) Continuation of application No. PCT/EP02/00814, filed on Jan. 26, 2002.

(30) Foreign Application Priority Data
Apr. 11, 2001 (DE) ................................. 101 18 130

(51) Int. Cl.
  *C30B 25/04* (2006.01)
(52) U.S. Cl. .............................. 117/90; 117/91; 117/99; 117/101; 117/102; 117/104
(58) Field of Classification Search .................. 117/90, 117/91, 99, 104, 101, 102
See application file for complete search history.

(56) References Cited

U.S. PATENT DOCUMENTS

| | | | | |
|---|---|---|---|---|
| 3,690,290 A | | 9/1972 | Jarvela et al. ................. | 118/48 |
| 4,888,303 A | * | 12/1989 | Quinlan ........................ | 117/99 |
| 4,975,388 A | * | 12/1990 | Guedon et al. ................ | 117/91 |
| 5,660,626 A | | 8/1997 | Ohta et al. ..................... | 117/84 |
| 5,660,628 A | | 8/1997 | Sato et al. ..................... | 117/84 |
| 5,702,532 A | | 12/1997 | Wen et al. ................... | 118/730 |
| 6,080,642 A | | 6/2000 | Van Geelen et al. ........ | 438/478 |
| 6,086,673 A | * | 7/2000 | Molnar ......................... | 117/90 |
| 6,179,913 B1 | * | 1/2001 | Solomon et al. .............. | 117/99 |

FOREIGN PATENT DOCUMENTS

EP 0 687 749 A1 12/1995

OTHER PUBLICATIONS

P.M. Frijlink, A New Versatile, Large Movpe Recator, Journal of Crytal Growth, Nov./Dec. 1998, Nos. 1-4. pp. 207-215.
H. Jurgensen, Large-scale MOVPE production systems, Microelectronic Engineering, May 18, 1992, Nos. 1/2, pp. 119-148.
O.Scheon, M. Schwambera, B. Schineller, D. Schmitz, M. Heuken and H. Jurgensen; High quality III-nitride material grown in mass production MOCVD systems, Journal of Crystal Growth, 1998. pp. 297-303.

* cited by examiner

Primary Examiner—Robert Kunemund
(74) Attorney, Agent, or Firm—St. Onge Steward Johnston & Reens LLC (57) ABSTRACT

The invention relates to a device and to a method for depositing especially crystalline layers from the gas phase onto especially crystalline substrates. The device comprises a heated reaction chamber with a substrate support that receives at least one substrate; one or more heated sources where a gaseous halide is formed by chemical reaction of a halogen, especially HCl, fed to the source together with a substrate gas, and a metal, for example GA, In, Al associated with the source, which is transported through a gas inlet section to a substrate supported by the substrate support; and a hydride supply for supplying a hydride, especially $NH_3$, $AsH_3$ or $PH_3$ into the reaction chamber. A plurality of rotationally driven substrate supports is disposed in an annular arrangement on a substrate support carrier, the sources being disposed in the center of said substrate carrier.

20 Claims, 10 Drawing Sheets

METHOD FOR DEPOSITING ESPECIALLY CRYSTALLINE LAYERS FROM THE GAS PHASE ONTO ESPECIALLY CRYSTALLINE SUBSTRATES

This application is a continuation of pending International Patent Application No. PCT/EP02/00814 filed on Jan. 26, 2002, which designates the United States and claims priority of pending German Application No. 101 18 130.2 filed on Apr. 11, 2001.

FIELD OF THE INVENTION

The invention relates to a device or method for depositing in particular crystalline layers on in particular crystalline substrates from the gas phase. Known devices have a heated reaction chamber with a substrate holder for receiving at least one substrate, as well as one or more heated sources, where by chemical reaction of a halogen, in particular HCl, which is fed to the source together with a carrier gas, and a metal, for example Ga, In or Al, which is arranged at the source. A gaseous halide is formed, which is conveyed through a gas inlet section to a substrate supported by a substrate holder, a hydride feedline for feeding a hydride, in particular $NH_3$, $AsH_3$ or $PH_3$, into the reaction chamber being also provided. In addition, a dopant can be added in order to dope the deposited semiconductor layer in the desired way. The dopant used is, inter alia, a highly dilute hydride, such as for example $SiH_4$, or a chloride, for example $FEC^2$. However, it is also possible to use $H_2S$ or an organometallic compound as carrier for the dopant. Suitable compounds of this nature include in particular DEZn or DPZMg.

Devices of this type and/or the methods applied to the devices are used, inter alia, to deposit pseudo-substrates. This is possible on account of the relatively high growth rates (>200 μm/h). The 111-V pseudo-substrates are used to produce light-emitting diodes based on GaN, These are able to emit ultraviolet or blue or green light. In particular ultraviolet light can be converted into white light by means of suitable phosphors. A precondition for the manufacture of light-emitting diodes of this type is the provision of a suitable substrate. Unlike in the case of GaAs or InP, it is not possible to grow relatively large bulk GaN crystals for conventional substrate production. As an alternative to the bulk crystals from which the substrates in disk form are cut, it is also possible to use thick layers produced in an epitaxy process as pseudo-substrates.

The invention is therefore based on the object of providing a device or method with which the growth of layers for use as pseudo-substrates for the subsequent deposition of GaN layers is possible with a high growth rate on suitable substrates.

The object is achieved by the device defined in the claims and the method described therein.

According to the invention, it is firstly and substantially provided that a multiplicity of rotationally driven substrate holders is disposed in annular arrangement on a substrate holder carrier. The hydrides and/or halides may be fed into the center of the reaction chamber. However, it is also possible for the hydrides or halides to be fed to the reaction chamber from the periphery and discharged in the center. In both cases, the hydrides and/or halides flow through the reaction chamber in the radial direction.

The device according to the invention has one or more sources. These sources contain the metals Ga, In or Al. These sources may be arranged in the center of the substrate holder carrier, so that the halides are formed directly in the reaction chamber. Alternatively, it is also possible to generate the halides outside the reaction chamber. It is preferable for the halogen or the halides to be introduced into the center of the reactor. The source, which may be located outside or inside the reaction chamber, can be heated by means of IR light or by means of high frequency. The heating may also be effected by means of resistors. The substrate holder carrier may be rotationally driven. In this case, it rotates about the axis of symmetry of the reaction chamber in which the source is preferably arranged. The substrate holders on which the substrates, which are in circular disk form, rest during the carrying-on of the process, are disposed in the manner of satellites on the substrate holder carrier. The substrate holders themselves are rotationally driven, and for this purpose are also in the form of circular disks. The source may rotate with the substrate holder carrier or may be disposed in a fixed position in the reaction chamber. The supply of the hydride is preferably separate from the supply of the halide. The hydride feedline may be provided above the halide source. Since the growth process of the GaInAlN crystal is controlled by the presence of the hydride, $NH_3$, the hydride ($NH_3$) is only supplied immediately in front of the annularly arranged substrates, i.e. in a radially outwardly shifted position with respect to the feed of the halides. As an alternative to feeding in the hydride in a radial direction, the hydride may also emerge from openings which are arranged in the reaction chamber cover positioned opposite the substrates. These openings may be disposed uniformly over the annular substrate holder carrier. However, it is also possible for these openings, through which the hydride is passed into the reaction chamber, to be arranged in radial zones which are angularly offset with respect to one another. Between these radial zones there may be openings through which the halides are fed to the reaction chamber. The halides may in this case be produced inside or outside the reaction chamber. It is preferable for a plurality of sections for the introduction of different halides to be disposed offset with respect to one another in the circumferential direction. Introduction zones for the hydrides may be located between these sections. The sources may he disposed eccentrically, radially offset. The sources are heated. Accordingly, the metals Ga, In or Al are in liquid form. The metal may be taken up from a pan over which HCl or another halogen flows. In the process, the HCl reacts with the metal to form a volatile metal chloride. In particular the source for the aluminum may be configured as a container which is washed through by the gas, so that an optimum reaction takes place between the halogen and the aluminum. The source then functions similarly to a wash bottle. The substrates are disposed annularly around the center of the substrate holder carrier. They may be disposed in a very wide range of ways. By way of example, one substrate may be disposed on each substrate holder. However, it is also possible for a multiplicity of substrates to be disposed on one substrate holder. The substrate holders may be mounted on a gas cushion in a known way. The rotational drive is likewise effected in a known way by gas streams. One of the sources described can also be used to receive a dopant. The dopant used may be a metal, for example iron. However, it is also possible for the dopant to be introduced into the reaction chamber in gas form, in particular as a hydride. The dopant used may, for example, be $SiH_4$.

Exemplary embodiments are explained below with reference to appended drawings. They show:

FIG. 1 a schematic representation of the device according to the invention or the representation of the method, FIG. 2 likewise schematically, a first exemplary embodiment of a device, FIG. 3 a section on line III—III in FIG. 2, FIG. 4 a variation on the exemplary embodiment shown in FIG. 2, FIG. 5 a further exemplary embodiment oft the invention represented in the same way as in FIG. 2, FIG. 6 a variation on the exemplary embodiment shown in FIG. 5, FIG. 7 a further exemplary embodiment of the invention, FIG. 8 a representation of the exemplary embodiment shown in FIG. 7 from the viewing direction indicated by arrow VIII in FIG. 7, FIG. 9 a representation corresponding to that shown in FIG. 8 of a further exemplary embodiment, FIG. 10 the disposition of substrates on a substrate holder/substrate holder carrier, FIG. 11 a modification to the representation according to FIG. 10, FIG. 12 a further modification to the representation according to FIG. 10, and FIG. 13 a third modification to the representation according to FIG. 10.

The exemplary embodiments relate to devices for epitaxially depositing GaInAlN layers on substrates 3 disposed in a reaction chamber 1 from InCl, GaCl and AlCl, which have been introduced into the heated reaction chamber 1, together with $NH_3$ which has been introduced into the reaction chamber 1. For this purpose, the device has a source 4, which is held at a source temperature $T_s$ by means of a heater. The source includes pans 17 or container 18 which are filled with metallic In, Ga or Al. A mixture comprising a carrier gas, which may be hydrogen or nitrogen, and HCl, is passed over the pans 17 or through the container 18. The mass flow of this gas, in particular of the HCl, is set by means of mass flow controllers 19. The source reaction leads to InCl, GaCl or AlCl. These halides are introduced into the reaction chamber 1 through a gas inlet section 5. In order to form the 111-V layers, a hydride for providing the V component is also required. In the exemplary embodiment, this hydride is $NH_3$. However, $AsH_3$ or $PH_3$ may also be used instead of $NH_3$. The hydride is supplied through a hydride feedline 6. The mass flow of the hydride is likewise controlled by a mass flow controller 19.

The reaction chamber 1 has a substrate holder carrier 7, which is in the form of a ring or circular disk and is rotationally driven. As can be seen in particular from FIGS. 10–13, a multiplicity of substrate holders 2 is disposed in annular arrangement on the substrate holder carrier 7. The substrate holders 2 are in circular disk form and rest on a gas cushion 14 which is maintained by means of a gas stream flowing through a gas feedline (not shown in the drawings) This gas stream (not shown in the drawings) can also be used to rotationally drive the substrate holders 2, so that a double rotation is ensured.

The substrate holder carrier 7 is heated from below by means of high frequency. For this purpose, the device has a high frequency coil 11, which is disposed beneath the substrate holder carrier 7 consisting of graphite. That section 27 of the substrate holder carrier 7 which adjoins the reaction chamber 1 may be PBN-coated. However, it may also consist of quartz. The substrate holder 2 may be made from the same material. The cover 12 of the reaction chamber 1 is preferably made from quartz.

Figure 1:
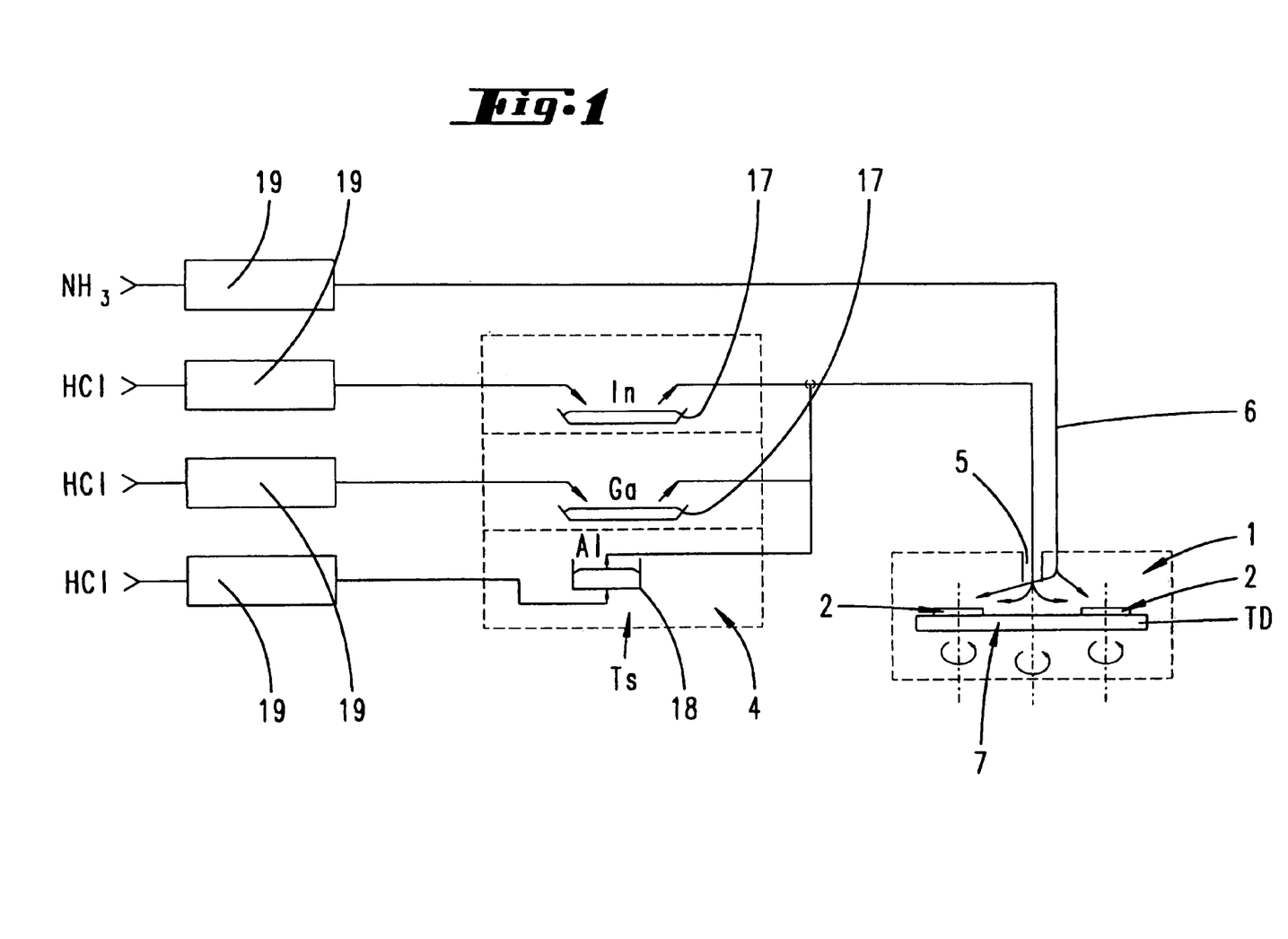
Figure 2:
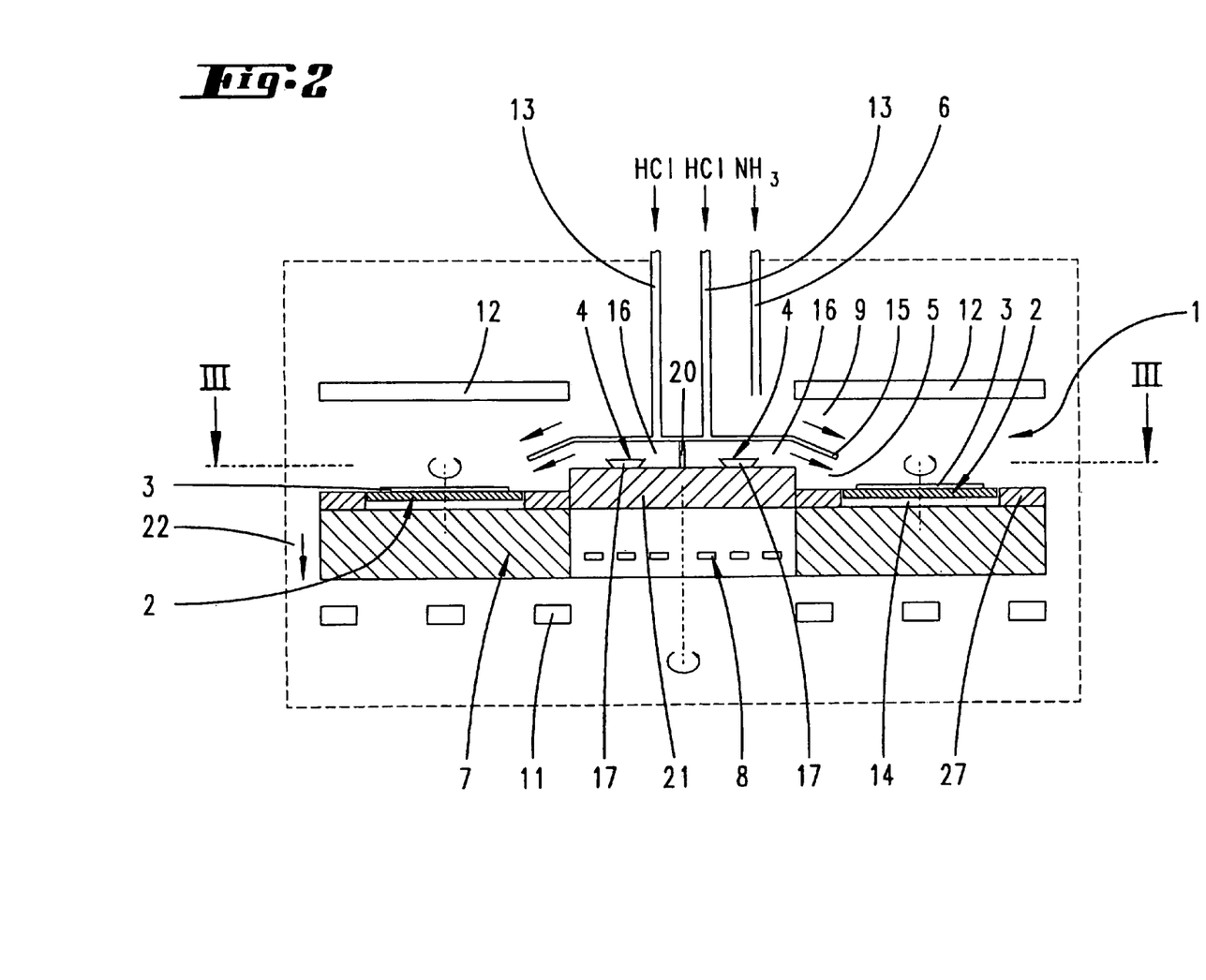

The exemplary embodiment illustrated in FIG. 2 has a source 4 which is located in the center of an annular substrate holder carrier 7. In this exemplary embodiment, the source carrier 21, on which the pans 17 or the container 18 are arranged, can rotate with the substrate holder carrier. The partition between the individual source chambers 16, which is denoted by 20 in FIG. 2, can also be dispensed with in this variant, so that all the metallic sources 4 are disposed in a common chamber. Instead of the plurality of HCl feedlines 13 illustrated in FIG. 2, it is then only necessary to use a single HCl feedline. However, it is also possible for the source carrier plate 21 not to rotate, but rather to remain fixed in position, so that the annular substrate holder carrier 7 rotates about the source arrangement. Particularly then, it is possible for the individual metal sources 4 to be spatially separated from one another by said partitions 20. As can be seen in particular from FIG. 3, four separate source chambers 16, in which the pans or container 18 for the different metals Ga, In or Al can be located, are formed by partitions 20. An individual HCl feedline is associated with each source chamber 16.

A shield 15 covers the source chamber 16. Above the shield 15, $NH_3$ flows out of a hydride feedline 6 into the reaction chamber 1. The shield 15 extends radially outward as far as directly in front of the substrate holders 2.

Figure 3:
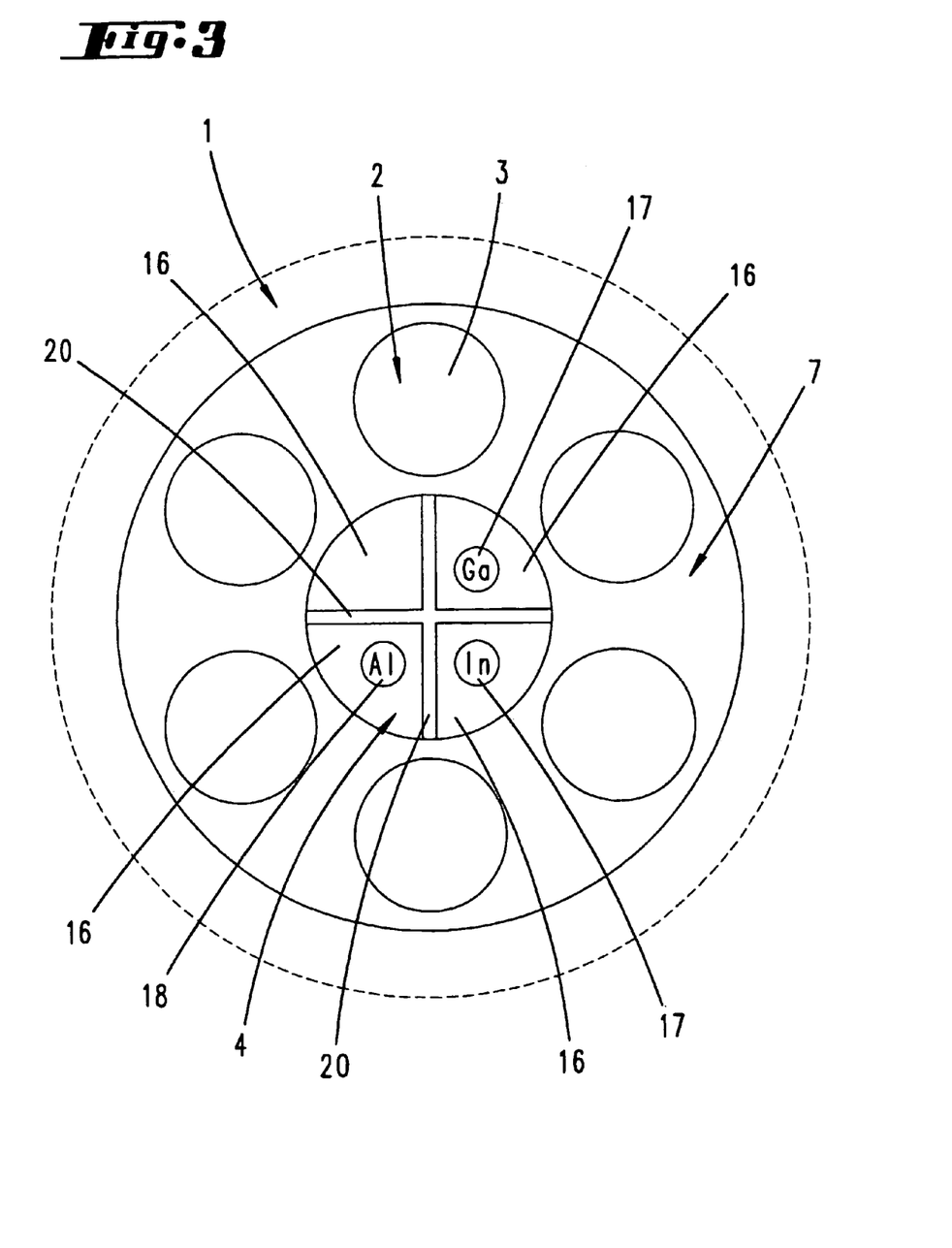
Figure 4:
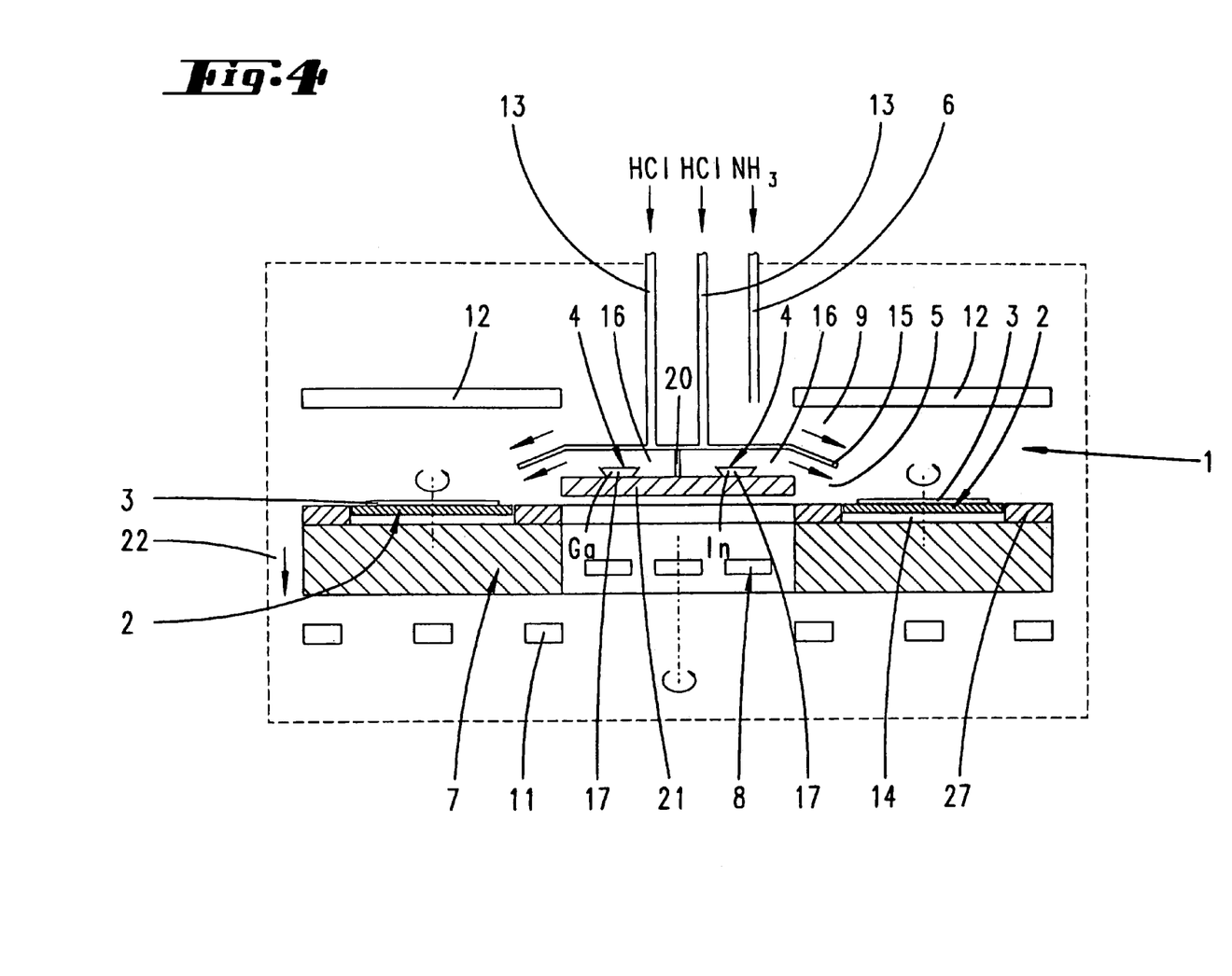

In the exemplary embodiments illustrated in FIGS. 2 to 4, the sources 4 are heated by a separate source heater 8. The source heater 8 comprises a high frequency coil.

The exemplary embodiment illustrated in FIG. 4 differs from the exemplary embodiment shown in FIG. 2 substantially through the fact that the source carrier plate 21 is also at a spatial distance from the substrate holder carrier 7.

Figure 5:
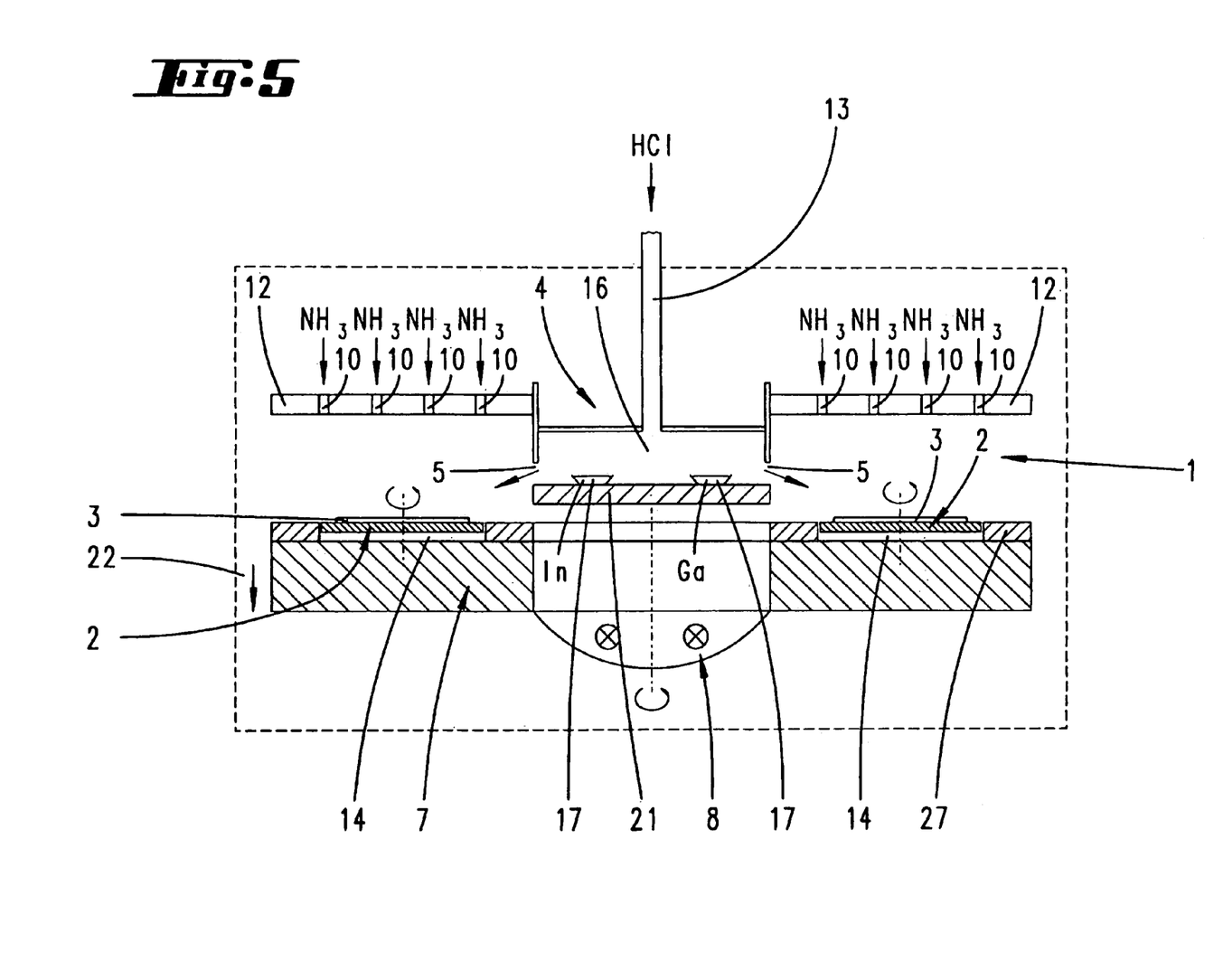

In the exemplary embodiment illustrated in FIG. 5, the source carrier 21 is heated by means of an infrared heater. In this exemplary embodiment, the pans 17 for receiving the metals are located in a common source chamber 16. In this case too, however, it is also possible for a plurality of source chambers to be provided by means of suitable partitions. The halides generated by the introduction of HCl through the feedline 13 into the chamber 16 pass, via the circumferential gap 5, into the annular reaction chamber 1, where the substrate holders 2 which rotate about the center and about their own axes are disposed. In this exemplary embodiment, the hydride ($NH_3$) is supplied through the cover 12 of the reaction chamber 1. For this purpose, the cover 12 has a multiplicity of hydride inlet openings 10. Overall, the cover 12 is in the form of a showerhead. In the drawings, the reference numeral 22 denotes the exhaust, which is disposed annularly around the substrate holder carrier 7.

Figure 6:
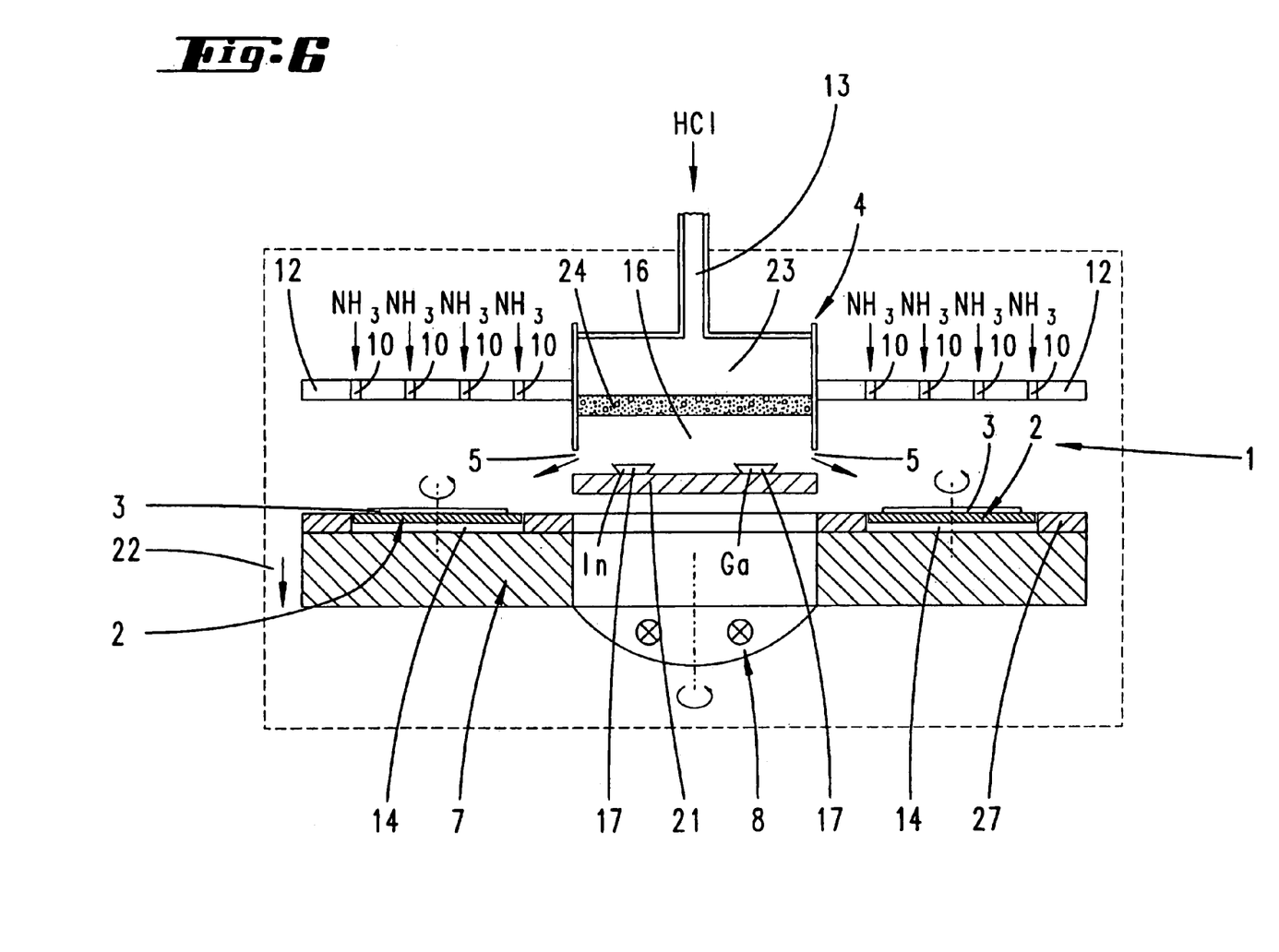

The exemplary embodiment illustrated in FIG. 6 has a differently configured source. In this exemplary embodiment, the HCl passes through a feedline 13 into an antechamber 23. The base of the antechamber 23 is formed by a frit 24. The frit 24 is located above a source chamber 16, so that the HCl can flow homogeneously onto the surfaces of the metal located in one or more pans 17.

Figure 7:
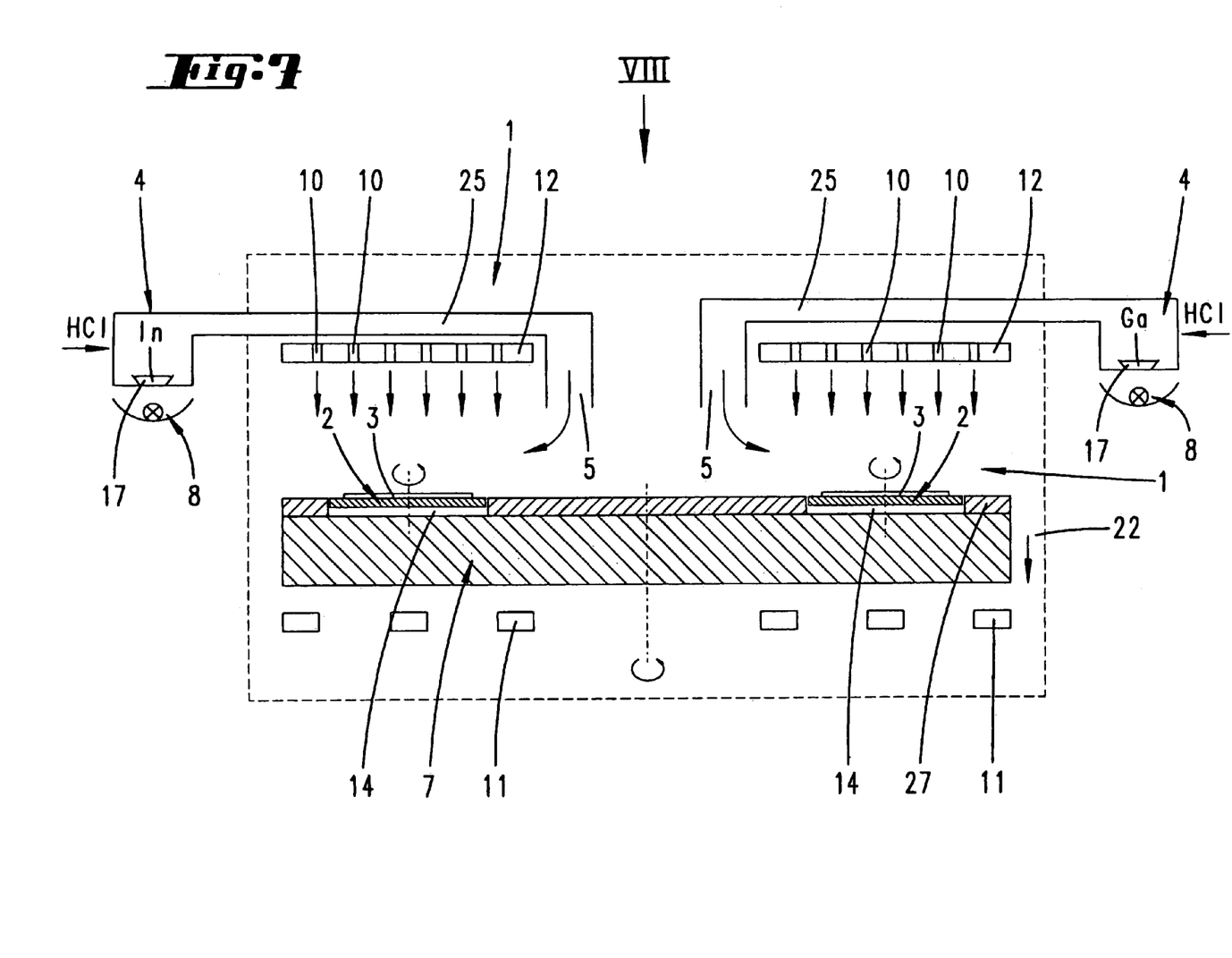

In the exemplary embodiment illustrated in FIG. 7, the sources 4 are located outside the reaction chamber 1.

Figure 8:
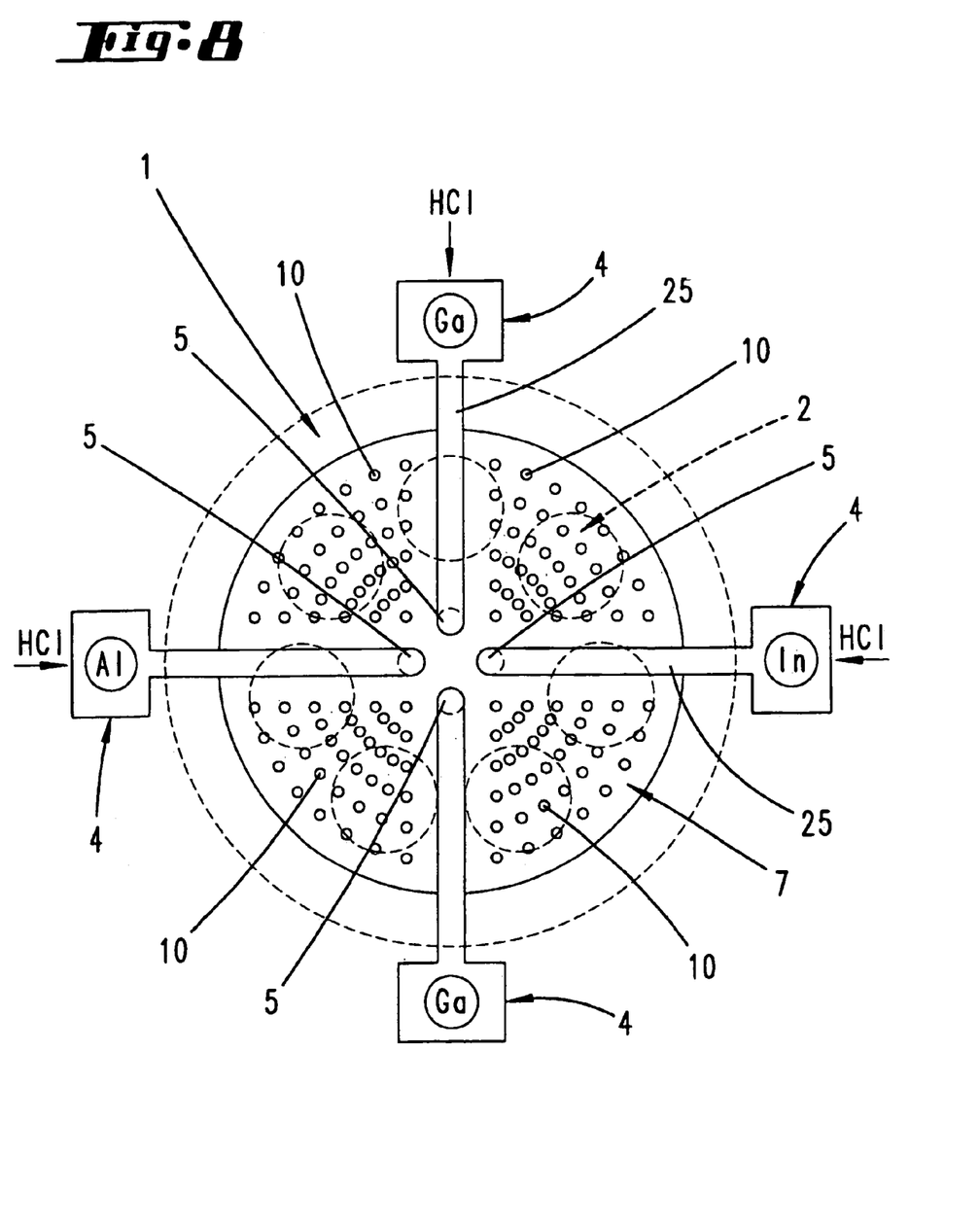

As can be seen in particular from FIG. 8 and also from FIG. 7, the sources 4 are disposed radially outwardly of the reaction chamber. The sources 4 are in each case held at the source temperature $T_3$ by means of an infrared heater 8. The halide generated in the sources 4 is passed by means of temperature—controlled lines 25 into the center of the reaction chamber 1, where it emerges from the ends 5 of the lines 25 in order to flow toward the substrates 3 in the radially outward direction. In this exemplary embodiment, the hydride is supplied from the cover 12 in which the above-described openings 10 are located for the showerhead—like feeding of the $NH_3$ into the reaction chamber.

As can be seen from FIG. 8, the hydride inlet openings 10 are arranged in a total of 4 radial sections.

Figure 9:
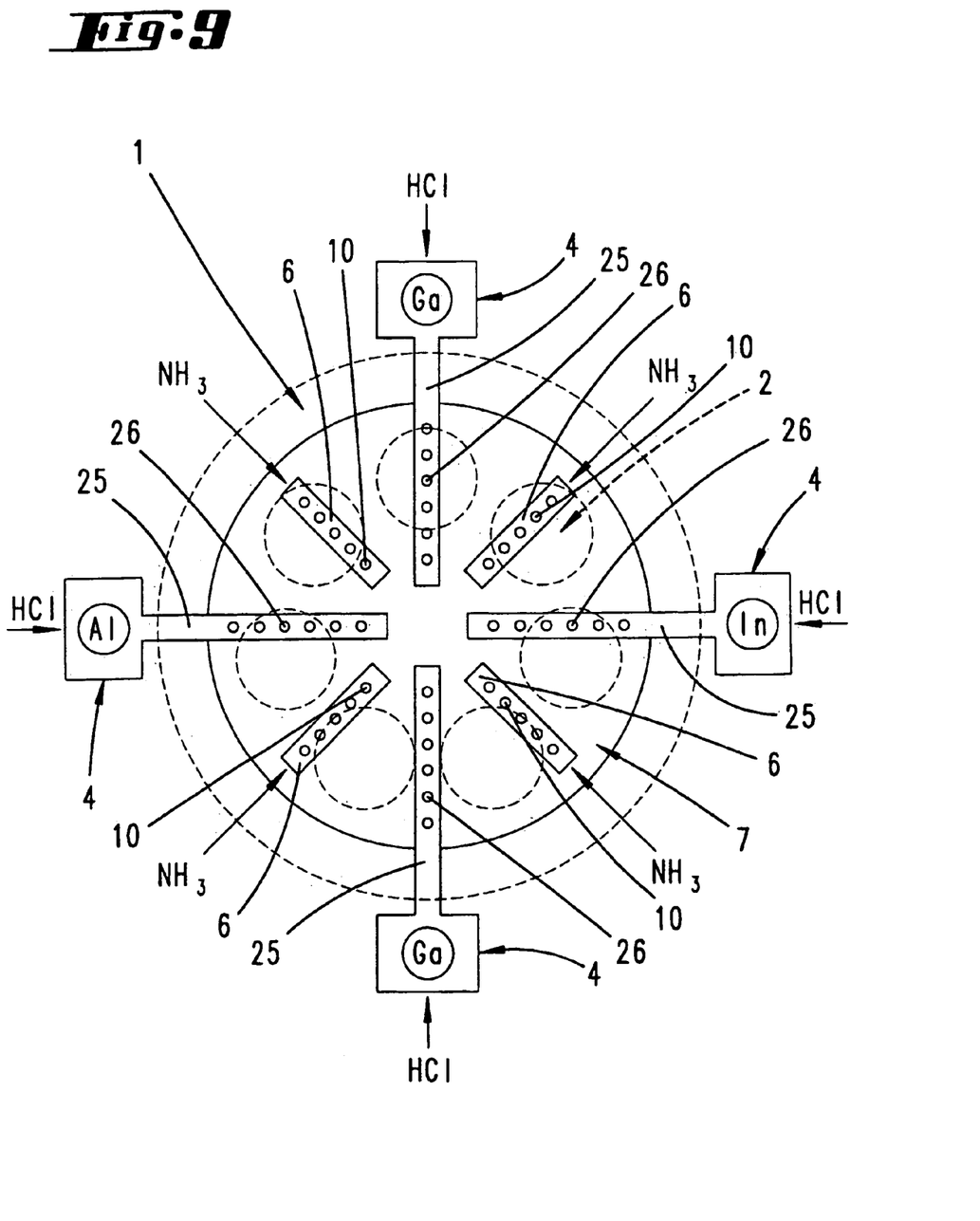
Figure 10:
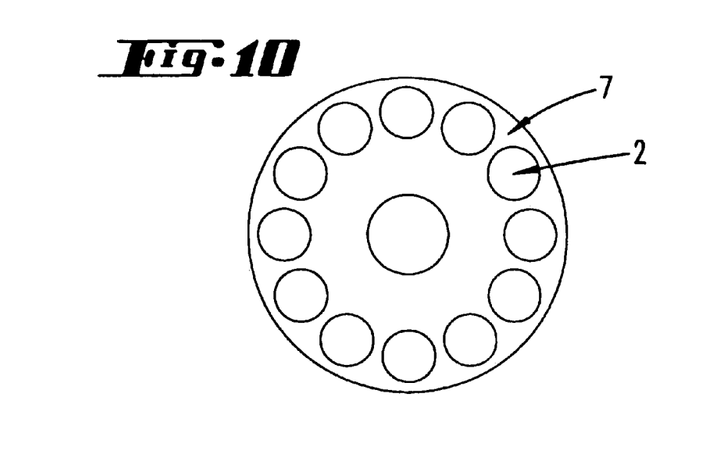
Figure 11:
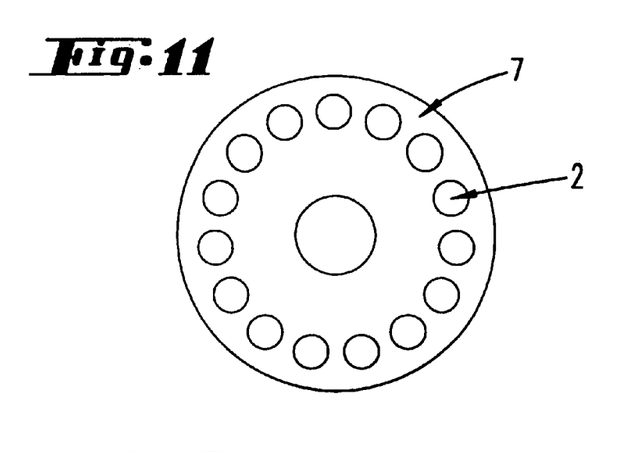

FIG. 9 shows a variant in which the halides are not introduced into the center of the reaction chamber 1, but rather through openings 26 which extend over the entire radius of the substrate holder carrier 7. Openings 26, 10 of this type, disposed in rows on a radial line, alternate in the circumferential direction, so that feedlines for the halides are in each case located between the feedlines for the hydrides. The substrates rotate under these comb-like feedlines while at the same time rotating about their own axes.

Figure 12:
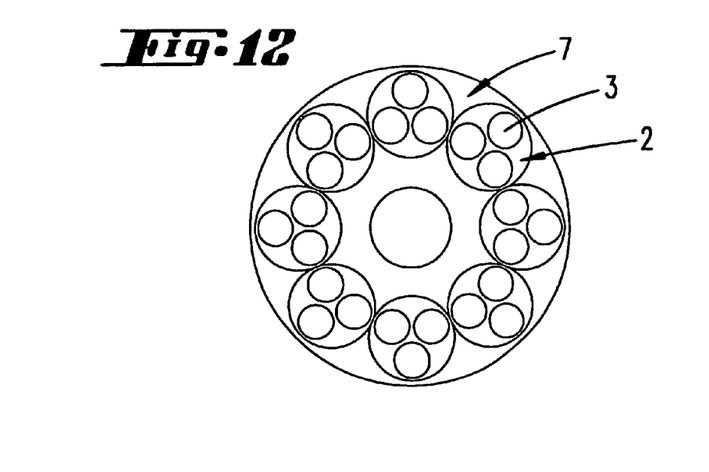
Figure 13:
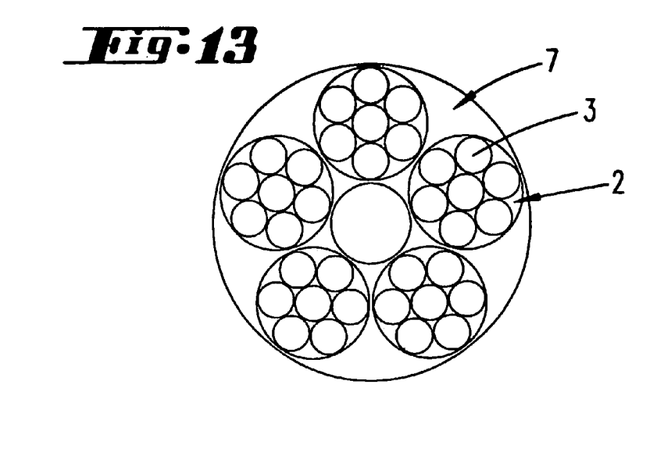

As can be seen from the examples presented in FIGS. 12 and 13, it is possible for a plurality of substrates 3 to be arranged on one substrate holder 2.

The rotation of the substrates 3 about their own axes serves substantially to optimize the layer thickness homogeneity. The rotation of the substrate holder 7 about the axis of symmetry of the reaction chamber 1 substantially serves to compensate for non-uniformities in the reaction chamber in the circumferential direction.

The invention is used not only to produce binary GaN pseudo-substrates. The possibility of additionally or alternatively using In or Ga as a III component offers the option of also producing ternary or quaternary substrates, such as AlGaN or GaInN.

As an alternative to $NH_3$, however, it is also possible for $AsH_3$ or $PH_3$ to be fed to the reaction chamber 1 via the hydride feedline 6.

While the source temperature $T_s$ is approximately 700° C. and the feedline 25 is at a temperature which is greater than the source temperature $T_s$, the substrate holder 2 is at a temperature $T_D$ of approximately 1000° C. or above. It is preferable for the substrate temperatures $T_s$ to be in a range between 1000 and 1100° C. A suitable substrate is Si. However, it is also possible to use $Al_2O_3$ substrates. The device can also be used to deposit a layer sequence. AlGaInN can be deposited simultaneously on a plurality of substrates as an interlayer. All this preferably takes place at growth rates of 100 μm/h and above. This makes it possible to produce crack-free AlGaInN/GaN layers which are approximately 200 μm thick. These layers can then be separated from the original substrates by mechanical/thermal means in order, as unsupported layers, in turn to serve as a low-defect GaN substrate. The process is carried out at a total pressure which is in the range from 1 to 1,500 mbar. It is also possible to mask the substrate with a dielectric mask prior to the coating operation. Material grows over the mask during the process. This overgrowth can be adjusted by means of the total pressure parameter. However, it is also possible to control this phenomenon by means of the temperature or the HCl flow rate or the $NH_3$ flow rate. The carrier gas used is preferably $H_2$.

The dopants are added to the reaction chamber in a similar way. The dopant provided may be a solid source, for example an iron source. This source can be exchanged for one of the existing Ga, In or Al sources. It is also possible for the free position 16 shown in FIG. 3 to be used for positioning the dopant source. A hydride can be used as a dopant as an alternative to the solid dopant source. In this context, silane may be considered. Finally, it is also possible for an organometallic compound to be used as the dopant. This is likewise introduced into the reaction chamber in gas form. In the process, it is preferable to use DPZMg. However, other dopants are also possible.

All the features disclosed are (inherently) pertinent to the invention. The content of disclosure of the associated/accompanying priority documents (copy of the prior application) is hereby incorporated in its entirety in the disclosure of the application, partly with a view to incorporating features of these documents in claims of the present application.

What is claimed is:

1. Device for depositing crystalline layers on crystalline substrates from the gas phase, which includes a heated growth chamber having a main substrate holder for receiving at least one substrate;
    one or more heated sources, where a gaseous halide is formed by chemical reaction of a halogen, in particular HCl, which is fed to the source together with a carrier gas, and a metal, for example Ga, In, Al, arranged at the source in the growth chamber, the gaseous halide being conveyed through a gas inlet section to the at least one substrate supported by the main substrate holder in the growth chamber;
    a hydride feedline for feeding a hydride, in particular $NH_3$, $AsH_3$ or $PH_3$, into the growth chamber, characterized in that the reaction chamber, has an axis of symmetry, and a multiplicity of rotationally driven substrate holders are arranged annularly about the axis of symmetry on the main substrate holder, the separately heatable sources being disposed adjacent to the axis of symmetry in the main substrate holder in the growth chamber.

2. Method for depositing crystalline layers on crystalline substrates from the gas phase comprising: providing a heated growth chamber having a main substrate holder for receiving at least one substrate;
    one or more heated sources, where a gaseous halide is formed by chemical reaction of a halogen, in particular HCl, which is fed to the source together with a carrier gas, and a metal, for example Ga, In, Al, arranged at the source in the growth chamber, the gaseous halide being conveyed through a gas inlet section to the at least one substrate supported by the main substrate holder in the growth chamber;
    a hydride feedline for feeding a hydride, in particular $NH_3$, $AsH_3$ or $PH_3$, into the growth chamber, characterized in that the reaction chamber has an axis of symmetry about which the main substrate holder is rotationally driven, on which substrate holder a multiplicity of substrate holders in annular arrangement about the axis of symmetry are rotationally driven, and the halide is generated in separately heated sources which are disposed adjacent to the axis of symmetry in the main substrate holder in the growth chamber; and
    depositing at least one crystalline layer on at least one crystalline substrate in said heated growth chamber.

3. The device according to claim 1, characterized in that the hydrides or the halides flow through the reaction chamber in the radial direction.

4. The device according to claim 3, characterized in that the halide or the halogen is introduced into the center of the reactor.

5. The device according to claim 4, characterized in that the source is heated by light or high frequency.

6. The device according to claim 5, characterized in that the substrate holder carrier is rotationally driven.

7. The device according to claim 6, characterized in that the source rotates with the substrate holder carrier or is fixed in position.

8. The device according to claim 7, characterized in that the hydride emerges from openings in the reaction chamber cover positioned opposite the substrate holder carrier.

9. The device according to claim 8, characterized in that the openings are distributed uniformly over the annular substrate holder carrier.

10. The device according to claim 9, characterized in that the openings are arranged in radial zones which are positioned angularly offset with respect to one another.

11. The device according to claim 10, characterized by sections with openings for the halides to enter, disposed between the radial zones.

12. The device according to claim 11, characterized in that a plurality of sections for the introduction of different halides are disposed offset with respect to one another in the circumferential direction and are separated from one another in particular by the openings for introducing the hydride.

13. The device according to claim 12, characterized in that the sources are formed by halogen-swept pans or by halogen-washed-through containers.

14. The device according to claim 13, characterized in that the substrate holders mounted on gas cushions are rotationally driven by means of a gas stream.

15. The device according to claim 14, characterized in that Si or $Al_2O_3$ substrates, with a diameter of up to 300 mm, are used as substrate material.

16. The device according to claim 15, characterized in that a GaN layer and/or layer sequence comprising AlGaInN are applied to the substrates.

17. The device according to claim 16, characterized in that the layers or layer sequences, which are approx. 200 µm thick, are removed from the substrate and used as substrate for the deposition of GaN.

18. The device according to claim 17, characterized in that a gaseous dopant is also introduced into the reaction chamber in parallel with the hydride from Group V.

19. The device according to claim 18, characterized by one or more sources for receiving a solid or liquid dopant which is conveyed into the reaction chamber as a halide.

20. Device for depositing crystalline layers on crystalline substrates from the gas phase, which includes a heated growth chamber having a main substrate holder for receiving at least one substrate;

one or more heated sources, where a gaseous halide is formed by chemical reaction of a halogen which is fed to the source together with a carrier gas, and a metal arranged at the source in the growth chamber, the gaseous halide being conveyed through a gas inlet section to the at least one substrate supported by the main substrate holder in the growth chamber;

a hydride feedline for feeding a hydride into the growth chamber, characterized in that the growth chamber, has an axis of symmetry, and a multiplicity of rotationally driven substrate holders are arranged annularly about the axis of symmetry on the main substrate holder, the separately heatable sources located in the main substrate holder in the growth chamber.

* * * * *